United States Patent
Jung et al.

(10) Patent No.: US 8,686,772 B2
(45) Date of Patent: Apr. 1, 2014

(54) FREQUENCY MULTIPLIER AND METHOD OF MULTIPLYING FREQUENCY

(75) Inventors: Seong-Ook Jung, Seoul (KR); Jiwan Jung, Seoul (KR); Kyungho Ryu, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 13/613,550

(22) Filed: Sep. 13, 2012

(65) Prior Publication Data

US 2013/0120031 A1    May 16, 2013

(30) Foreign Application Priority Data

Nov. 11, 2011   (KR) .................. 10-2011-0117770

(51) Int. Cl.
*H03K 3/84* (2006.01)
(52) U.S. Cl.
USPC ............ 327/164; 327/119; 327/149; 327/172
(58) Field of Classification Search
USPC .................................. 327/119, 149, 164, 172
See application file for complete search history.

(56) References Cited

U.S. PATENT DOCUMENTS

2010/0013530 A1*  1/2010  Kim et al. ................. 327/149
2011/0074469 A1   3/2011  Rapinoja et al.

FOREIGN PATENT DOCUMENTS

| JP | 09-098072        | 4/1997  |
| KR | 1020060108367 A  | 10/2006 |
| KR | 1020080017641 A  | 2/2008  |
| KR | 1020080088250 A  | 10/2008 |
| KR | 1020080096969 A  | 11/2008 |
| KR | 1020090126944 A  | 12/2009 |

* cited by examiner

*Primary Examiner* — John Poos
(74) *Attorney, Agent, or Firm* — Carter, DeLuca, Farrell & Schmidt LLP

(57) ABSTRACT

A frequency multiplier in accordance with some embodiments of the inventive concept may include a pulse generator receiving a differential clock signal from a delay locked loop having a plurality of delay cells to generate a pulse signal for generation of a multiplication clock signal. The pulse generator comprises an intermediate pulse signal generation unit receiving the differential clock signal to generate intermediate pulse signals; and an overlap correction unit correcting an overlap between the intermediate pulse signals to generate correction pulse signals.

15 Claims, 9 Drawing Sheets

FREQUENCY MULTIPLIER AND METHOD OF MULTIPLYING FREQUENCY

CROSS-REFERENCE TO RELATED APPLICATIONS

This U.S. non-provisional patent application claims priority under 35 U.S.C. §119 of Korean Patent Application No. 10-2011-0117770, filed on Nov. 11, 2011, the entire contents of which are hereby incorporated by reference.

BACKGROUND

The inventive concept disclosed herein relates to a frequency multiplier and a method of multiplying a frequency.

A delay locked loop (DLL) may be used to generate an internal clock in an electronic device. A conventional delay locked loop delays a received external clock by a predetermined time using a delay line to generate an internal clock synchronized with the external clock. As compared with a clock generating device based on a phase locked loop and a local oscillator, a clock generating device based on the delay locked loop no jitter accumulation and a simple loop filter structure, thus it has a small phase noise and can be miniaturized. In case of a semiconductor memory device, a data transmission speed can be increased by using an internal clock which is formed by frequency multiplication of the external clock and an error can be reduced when transmitting data at high speed by using clocks having an accurate phase delay and an accurate duty rate.

A frequency multiplier using a delay locked loop may include a pulse generator, an edge combiner and a multiplication rate control unit. The pulse generator receives a delayed signal from a delay locked loop to generate a pulse using for example a flip-flop circuit. An overlap due to a variation of process voltage temperature (PVT) may occur between pulses generated by the pulse generator. The overlap leads to an increase of power consumption of the edge combiner, thereby increasing a power consumption of the frequency multiplier.

The edge combiner generates a clock signal using a PMOS or NMOS transistor. In this case, as a multiplication rate becomes high, the number of PMOSs and NMOSs that are necessary is increased, thereby increasing junction capacitance of output terminal. As a result, as a multiplication rate increases, the maximum frequency that can be generated is reduced and power consumption of frequency multiplier increases.

SUMMARY

Embodiments of the inventive concept provide a frequency multiplier. The frequency multiplier may include a pulse generator receiving a differential clock signal from a delay locked loop having a plurality of delay cells to generate a pulse signal for generation of a multiplication clock signal, wherein the pulse generator comprises: an intermediate pulse signal generation unit receiving the differential clock signal to generate intermediate pulse signals; and an overlap correction unit correcting an overlap between the intermediate pulse signals to generate correction pulse signals.

Embodiments of the inventive concept also provide a frequency multiplier. The frequency multiplier may include a delay locked loop comprising a first delay line connecting a plurality of delay cells sequentially delaying a reference signal and a second delay line connecting the plurality of delay cells; an intermediate pulse signal generation unit which is connected to the first and second delay lines and generates intermediate pulse signals; and an overlap correction unit which is connected to the intermediate pulse signal generation unit and corrects an overlap between the intermediate pulse signals to generate a correction pulse signal.

Embodiments of the inventive concept also provide a frequency multiplier. The frequency multiplier may include a delay locked loop comprising a first delay line connecting a plurality of delay cells sequentially delaying a reference signal and a second delay line connecting the plurality of delay cells; a plurality of NOR logic gates receiving an input signal of nth ($n \geq 1$, n is an odd number) delay cell of the second delay line and an input signal of n+1th delay cell of the first delay line to generate a first pulse signal; and a plurality of NAND logic gates receiving an input signal of n+1th ($n \geq 1$, n is an odd number) delay cell of the first delay line and an input signal of n+2th delay cell of the second delay line to generate a second pulse signal.

Embodiments of the inventive concept also provide a method of multiplying a frequency. The method may include receiving a differential clock signal from a delay locked loop having a plurality of delay cells to generate intermediate pulse signals for generation of multiplication clock signal; performing a logic combination on the intermediate pulse signals to generate correction pulse signals that an overlap between the intermediate pulse signals is corrected; and generating a multiplication clock signal using the correction pulse signals.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF THE EMBODIMENTS

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will be understood that, although the terms first, second, etc. may be used herein to describe various elements, these elements should not be limited by these terms. These terms are only used to distinguish one element from another.

Embodiments of the inventive concept relate to a frequency multiplier and a method of multiplying a frequency using the frequency multiplier. A frequency multiplier in accordance with some embodiments of the inventive concept can be applied to various fields requiring a multiplied clock signal. The frequency multiplier can be applied to, for example, a semiconductor memory.

A frequency multiplier in accordance with some embodiments of the inventive concept can generate a multiplication clock signal. A pulse generator of frequency multiplier in accordance with some embodiments of the inventive concept can generate a pulse signal for generation of a multiplication clock signal. An overlap between generated pulse signals can operate a PMOS transistor and an NMOS transistor of edge combiner at the same time, thereby causing unnecessary power consumption. However, a frequency multiplier in accordance with some embodiments of the inventive concept can correct an overlap between pulse signals generated from a pulse generator. A frequency multiplier in accordance with some embodiments of the inventive concept can reduce power consumption. A frequency multiplier in accordance with some embodiments of the inventive concept can also increase the maximum frequency being generated.

Figure 1:
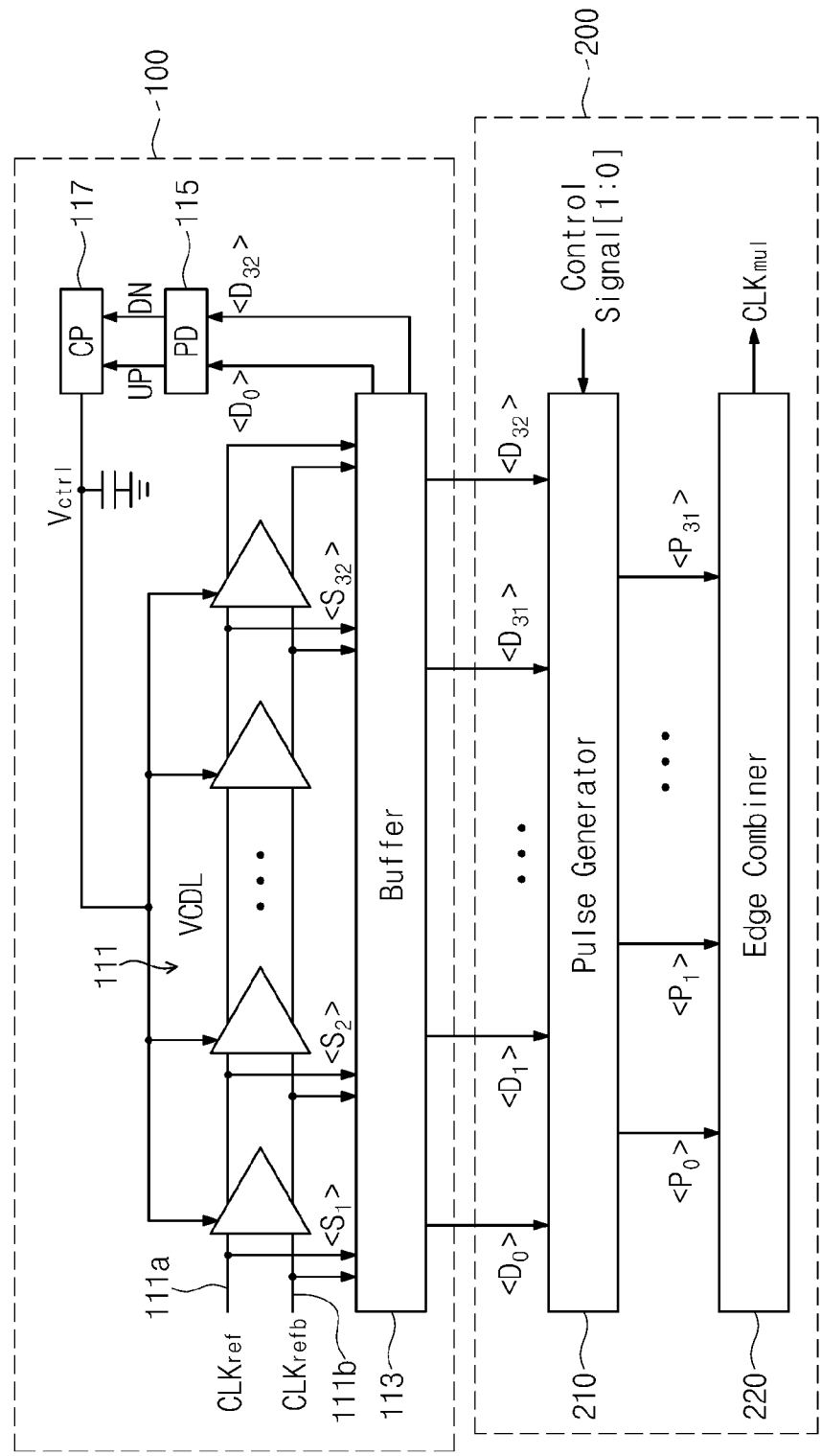
FIG. 1 is a drawing illustrating a frequency multiplier in accordance with some embodiments of the inventive concept.

FIG. 1 is a drawing illustrating a frequency multiplier in accordance with some embodiments of the inventive concept. In the embodiment, a frequency multiplier having a multiplication rate of 16 times is described as an illustration but the inventive concept is not limited thereto.

Referring to FIG. 1, a frequency multiplier in accordance with some embodiments of the inventive concept may include a delay locked loop 100 and a multiplication unit 200. The frequency multiplier generates a multiplication clock signal $CLK_{mul}$ using differential clock signals generated from the delay locked loop 100.

The delay locked loop 100 includes a voltage controlled delay line (VCDL) 111, a buffer 113, a phase detector (PD) 115 and a charge pump (CP) 117. The delay locked loop 100 may be designed to have a differential structure. The voltage control delay line 111 may include a first delay line 111a to which a reference signal $CLK_{ref}$ is input and a second delay line 111b to which a signal $CLK_{refb}$ that is an inverted version of the reference signal $CLK_{ref}$ is input. The signal $CLK_{refb}$ will be called "inverted reference signal". Each of the first and second delay lines 111a and 111b may be connected to a plurality of delay cells $S_1$ through $S_{32}$. In the present embodiment, 32 number of delay cells $S_1$ through $S_{32}$ are illustrated.

The delay locked loop 100 can detect a phase difference between a reference clock signal $D_0$ that passed through the buffer 113 and the last clock signal $D_{32}$ that passed through the buffer 113 after passing through the voltage controlled delay line 111, using the phase detector (PD) 115. The charge pump (CP) 117 can convert signals UP and DN corresponding to the detected phase difference into a voltage control signal $V_{ctrl}$. The voltage controlled delay line 111 generates delay which is in proportion to the voltage control signal $V_{ctrl}$ and can lock the delay locked loop 100 so that a phase difference between the reference clock signal $D_0$ and the last clock signal $D_{32}$ becomes 0. In a state that the delay locked loop 100 is locked, the voltage controlled delay line 111 can generate clocks delayed for as many as the delay cells $S_1$ through $S_{32}$ during one period. The delay locked loop 100 can generate differential clock signals $D_0$ through $D_{32}$ and $D_{0b}$ through $D_{32b}$. The $D_0$ may be the reference signal $CLK_{ref}$. The $D_{0b}$ may be the inverted reference signal $CLK_{refb}$. $D_n$ (n is natural number) may be a signal that the reference signal $D_0$ is delayed for n number of delay cells and $D_{nb}$, (n is natural number) may be a signal that the inverted reference clock signal $D_{0b}$ is delayed for n number of delay cells. In the present embodiment, an interval between the differential clock signals $D_0$ through $D_{32}$ and $D_{0b}$ through $D_{32b}$ may be $T_{ref}/32$ when the number of delay cells is 32. The $T_{ref}$ may mean a period of the reference signal $D_0$.

The multiplication unit 200 may include a pulse generator 210 and an edge combiner 220. The pulse generator 210 can generate a pulse signal for generation of a multiplication clock signal $CLK_{mul}$. The edge combiner 220 may toggle at every rising edge and falling edge of pulse signal generated from the pulse generator 210 to generate the multiplication clock signal $CLK_{mul}$.

The multiplication unit 200 can receive the differential clock signals $D_0$ through $D_{32}$ and $D_{0b}$ through $D_{32b}$ to generate the multiplication clock signal $CLK_{mul}$. The pulse generator 210 can generate intermediate pulse signals $M_0$ through $M_{32}$ using the differential clock signals $D_0$ through $D_{32}$ and $D_{0b}$ through $D_{32b}$. The pulse generator 210 can generate pulse signals $P_0$ through $P_{32}$ where an overlap due to a variation of process voltage temperature (PVT) is corrected. The edge combiner 220 can receive the corrected pulse signals $P_0$ through $P_{32}$ to generate the multiplication clock signal $CLK_{mul}$. In the present embodiment, a multiplication clock signal of 16 times is generated as an illustration.

Figure 2:
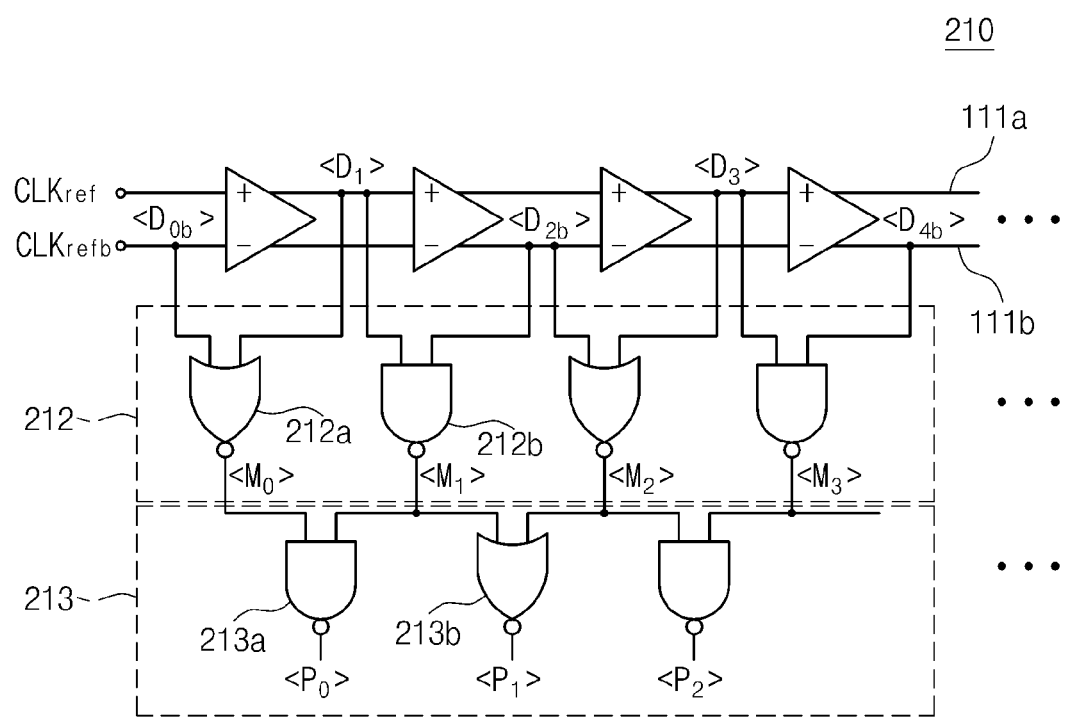
FIG. 2 is a drawing illustrating a pulse generator in accordance with some embodiments of the inventive concept.

FIG. 2 is a drawing illustrating a pulse generator in accordance with some embodiments of the inventive concept.

Referring to FIG. 2, a pulse generator 210 in accordance with some embodiments of the inventive concept may include an intermediate pulse signal generation unit 212 receiving differential clock signals $D_0$ through $D_{32}$ and $D_{0b}$ through $D_{32b}$ to generate intermediate pulse signals $M_0$ through $M_{32}$ and an overlap correction unit 213 correcting an overlap between the intermediate pulse signals $M_0$ through $M_{32}$ to generate correction pulse signals $P_0$ through $P_{32}$.

The intermediate pulse signal generation unit 212 may be connected to a first delay line 111a and a second delay line 111b. The intermediate pulse signal generation unit 212 may include an intermediate NOR logic gate 212a receiving an input signal of nth delay cell (n≥1, n is an odd number) of the second delay line 111b and an input signal of n+1th (n≥1, n is an odd number) delay cell of the first delay line 111a to generate a first intermediate pulse signal and an intermediate NAND logic gate 212b receiving an input signal of n+1th (n≥1, n is an odd number) delay cell of the first delay line 111a and an input signal of n+2th (n≥1, n is an odd number) delay cell of the second delay line 111b to generate a second intermediate pulse signal. The intermediate NOR logic gate 212a and the intermediate NAND logic gate 212b may be the plural number and the number of the intermediate NOR and NAND logic gates 212a and 212b can be varied depending on the number of the delay cells. In the present embodiment, 16 number of intermediate NOR logic gates 212a and 16 number of intermediate NAND logic gates 212b are illustrated. The intermediate NOR logic gate 212a and the intermediate NAND logic gate 212b may be alternately disposed.

The overlap correction unit 213 may include a correction NAND logic gate 213a receiving an output signal of nth intermediate NOR logic gate (n.gtoreq.1, n is an odd number) among intermediate NOR logic gates and an output signal of n+1th intermediate NAND logic gate (n.gtoreq.1, n is an odd number) among intermediate NAND logic gates to output a first correction pulse signal and a correction NOR logic gate receiving an output signal of n+2th intermediate NOR logic gate (n.gtoreq.1, n is an odd number) among intermediate NOR logic gates and an output signal of n+1th intermediate NAND logic gate (n.gtoreq.1, n is an odd number) among intermediate NAND logic gates to output a second correction pulse signal. The correction NAND logic gate 213a and the correction NOR logic gate 213b may be the plural number and the number of the correction NAND and NOR logic gates 213a and 213b can be varied depending on the number of the delay cells. In the present embodiment, 16 number of correction NAND logic gates 213a and 15 number of correction NOR logic gates 213b are illustrated. The correction NAND logic gate 213a and the correction NOR logic gate 213b may be alternately disposed.

Figure 3:
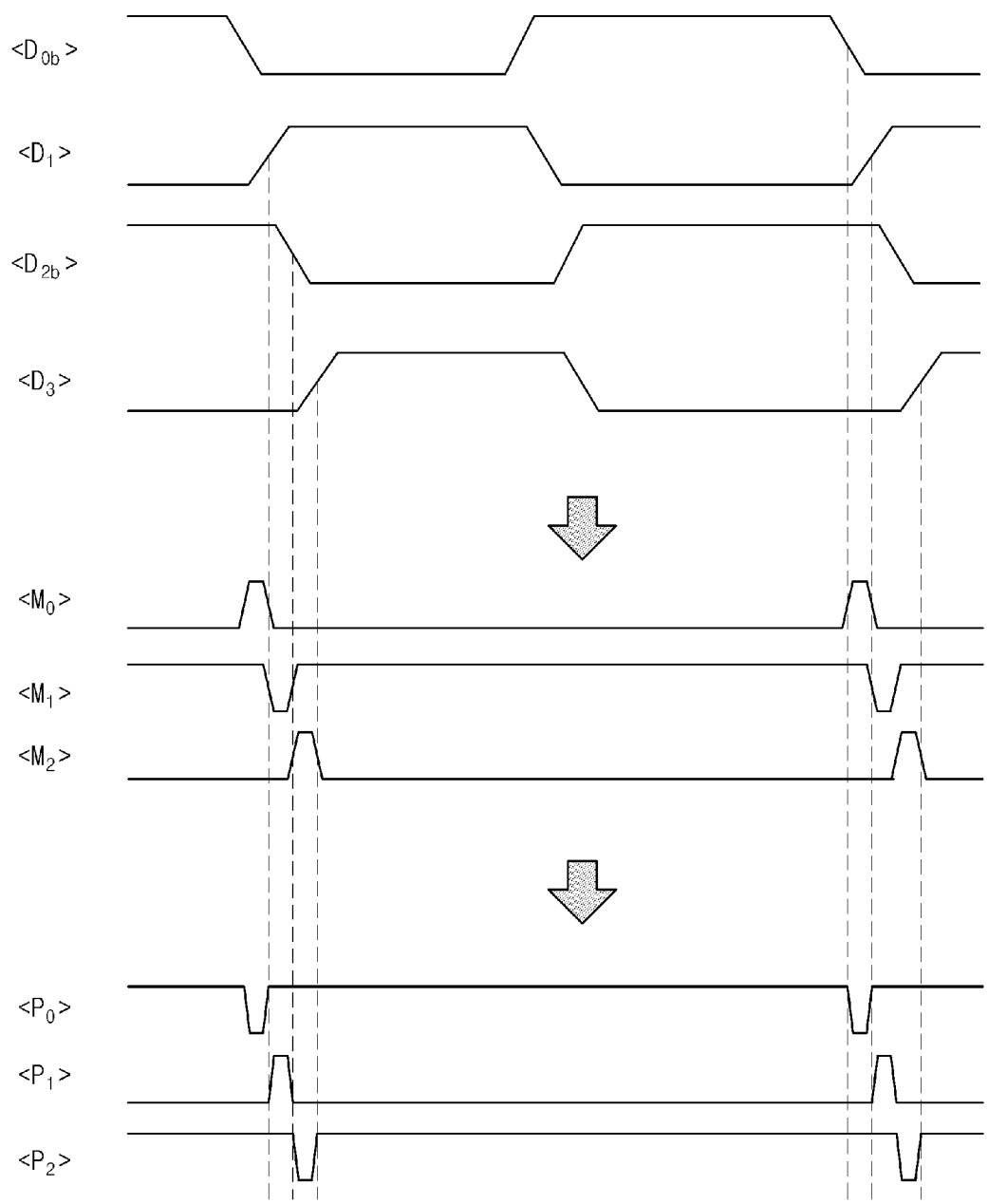
FIG. 3 is a timing diagram illustrating a process of pulse generator in accordance with some embodiments of the inventive concept.

FIG. 3 is a timing diagram illustrating a process of pulse generator in accordance with some embodiments of the inventive concept.

Referring to FIGS. 2 and 3, the reference signal $CLK_{ref}$ may be input into a first delay line 111a of the delay locked loop 100. The inverted reference signal $CLK_{refb}$ may be input into a second delay line 111b of the delay locked loop 100. $D_{0b}$ may be the inverted reference signal $CLK_{refb}$. $D_1$ may be a signal that the reference signal $CLK_{ref}$ is delayed for Tref/32. $D_{2b}$ may be a signal that the $D_{0b}$ is delayed for Tref/16. $D_3$ may be a signal that the $D_1$ is delayed for Tref/16. $D_{4b}$ may be a signal that the $D_{2b}$ is delayed for Tref/16.

The intermediate NOR logic gate 212a may receive $D_{0b}$ and $D_1$. A NOR logic gate outputs logic high (e.g., 1) only when signals being input are all logic low (e.g., 0). Thus, the intermediate pulse signal $M_0$ outputs logic high (e.g., 1) in a section in which $D_{0b}$ and $D_1$ are all logic low (e.g., 0). That is, the intermediate pulse signal $M_0$ rises in a pulse section in which $D_{0b}$ is falling near logic 0 and falls in a pulse section in which $D_1$ is rising from the logic 0.

The intermediate NAND logic gate 212b may receive $D_1$ and $D_{2b}$. A NAND logic gate outputs logic low (e.g., 0) only when signals being input are all logic high (e.g., 1). Thus, the intermediate pulse signal $M_1$ outputs logic low (e.g., 0) in a section in which $D_1$ and $D_{2b}$ are all logic high (e.g., 1). That is, the intermediate pulse signal $M_1$ falls in a pulse section in which $D_1$ is rising near logic 1 and rises in a pulse section in which $D_{2b}$ is falling near logic 1.

$D_{2b}$ and $D_3$ are input into a next intermediate NOR logic gate. An operation of the next intermediate NOR logic gate is the same with the operation of the intermediate NOR logic gate 212a described above. $D_3$ and $D_{4b}$ are input into a next intermediate NAND logic gate. An operation of the next intermediate NAND logic gate is the same with the operation of the intermediate NAND logic gate 212b described above.

In FIG. 3, a process of pulse generator is illustrated only about $D_{0b}$ through $D_3$ and $M_0$ through $M_2$ as an illustration, but the inventive concept is not limited thereto. That is, through the operations of the intermediate NOR logic gate and the intermediate NAND logic gate described above, intermediate pulse signals $M_0$ through $M_{32}$ may be generated. First intermediate pulse signals $M_0, M_2, M_4, \ldots, M_{32}$ may be generated through the operations of the intermediate NOR logic gates 212a described above. Second intermediate pulse signals $M_1, M_3, M_5, \ldots, M_{31}$ may be generated through the operations of the intermediate NAND logic gates 212b described above.

The correction NAND logic gate 213a can receive $M_0$ and $M_1$. In this case, the correction NAND logic gate 213a may output a correction pulse signal $P_0$ having a falling pulse section in a pulse section in which $M_0$ is rising. The correction NOR logic gate 213b can receive $M_1$ and $M_2$. In this case, the correction NOR logic gate 213b may output a correction pulse signal $P_1$ having a rising pulse section in a pulse section in which $M_1$ is falling.

$M_2$ and $M_3$ may be input into a next correction NAND logic gate. An operation of the next correction NAND logic gate is the same with the operation of the correction NAND logic gate 213a described above. Thus, the next correction NAND logic gate may output a correction pulse signal $P_2$. $M_3$ and $M_4$ may be input into a next correction NOR logic gate. An operation of the next correction NOR logic gate is the same with the operation of the correction NOR logic gate 213b described above. Thus, the next correction NOR logic gate may output a correction pulse signal $P_3$.

First correction pulse signals $P_0, P_2, P_4, \ldots, P_{30}$ may be generated through the operations of the correction NAND logic gates 213a described above. Second correction pulse signals $P_1, P_3, P_5, \ldots, P_{31}$ may be generated through the operations of the correction NOR logic gates 213b described above.

The pulse generator of the frequency multiplier in accordance with some embodiments of the inventive concept can correct an overlap due to a variation of PVT between the intermediate pulse signals $M_0$ through $M_{32}$ generated through the process described above. In the present embodiment, an overlap due to a variation of PVT can be removed by performing a logic combination on the intermediate pulse signals $M_0$ through $M_{32}$ generated by receiving differential clock signals $D_0$ through $D_{32}$ and $D_{0b}$ through $D_{32b}$ using the NAND logic gate and the NOR logic gate. For example, an overlap between $M_0$ and $M_1$ and an overlap between $M_1$ and $M_2$ may be removed. An overlap between generated pulse signals operates a PMOS transistor and an NMOS transistor of edge combiner at the same time, thereby causing unnecessary power consumption. A frequency multiplier in accordance with some embodiments of the inventive concept can reduce power consumption.

Figure 4:
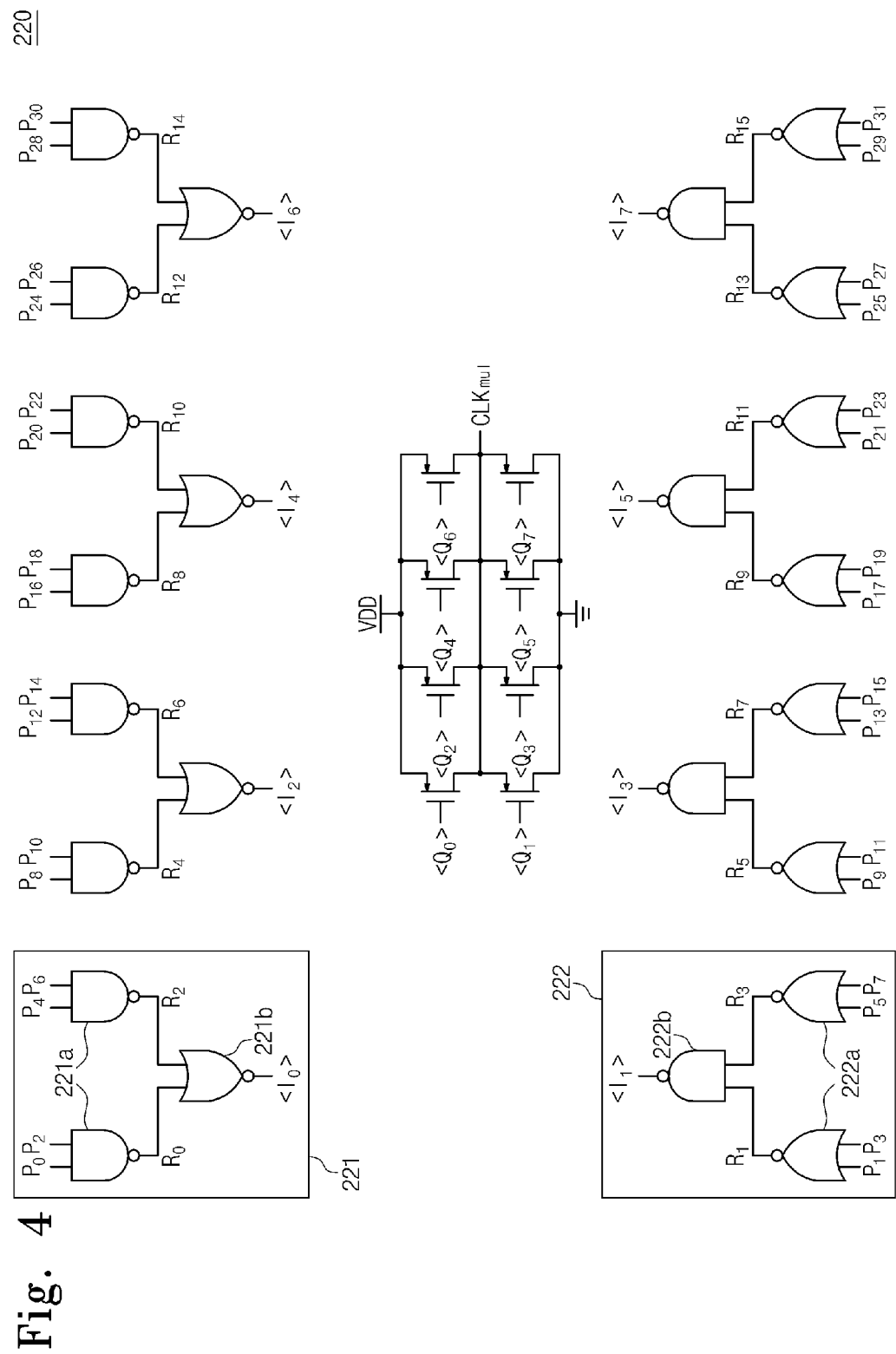
FIG. 4 is a drawing illustrating an edge combiner in accordance with some embodiments of the inventive concept.

FIG. 4 is a drawing illustrating an edge combiner in accordance with some embodiments of the inventive concept.

Referring to FIG. 4, the edge combiner 220 in accordance with some embodiments of the inventive concept may include control NAND logic gates 221a receiving the first correction pulse signals $P_0, P_2, P_4, P_6 \ldots, P_{28}, P_{30}$ from the overlap correction unit 213 of the pulse generator 210 to output a first intermediate control signal, input NOR logic gates 221b receiving the first intermediate control signal to output a first input control signal, control NOR logic gates 222a receiving the second correction pulse signals $P_1, P_3, P_5, P_7 \ldots, P_{29}, P_{31}$ from the overlap correction unit 213 of the pulse generator 210 to output a second intermediate control signal and input NAND logic gates 222b receiving the second intermediate control signal to output a second input control signal.

The two control NAND logic gates 221a and the input NOR gate 221b can constitute a PMOS input control unit 221. The two control NOR logic gates 222a and the input NAND gate 222b can constitute an NMOS input control unit 222.

The edge combiner 220 may further include PMOS transistors $Q_0$, $Q_2$, $Q_4$ and $Q_6$ which operate by receiving first input control signals $I_0$, $I_2$, $I_4$ and $I_6$ respectively and NMOS transistors $Q_1$, $Q_3$, $Q_5$ and $Q_7$ which operate by receiving second input control signals $I_1$, $I_3$, $I_5$ and $I_7$ respectively. Drains of the PMOS transistors may be connected to drains of the NMOS transistors respectively. A multiplication clock signal $CLK_{mul}$ may be generated through an output terminal connected to the drains of the PMOS transistors and the NMOS transistors.

Figure 5:
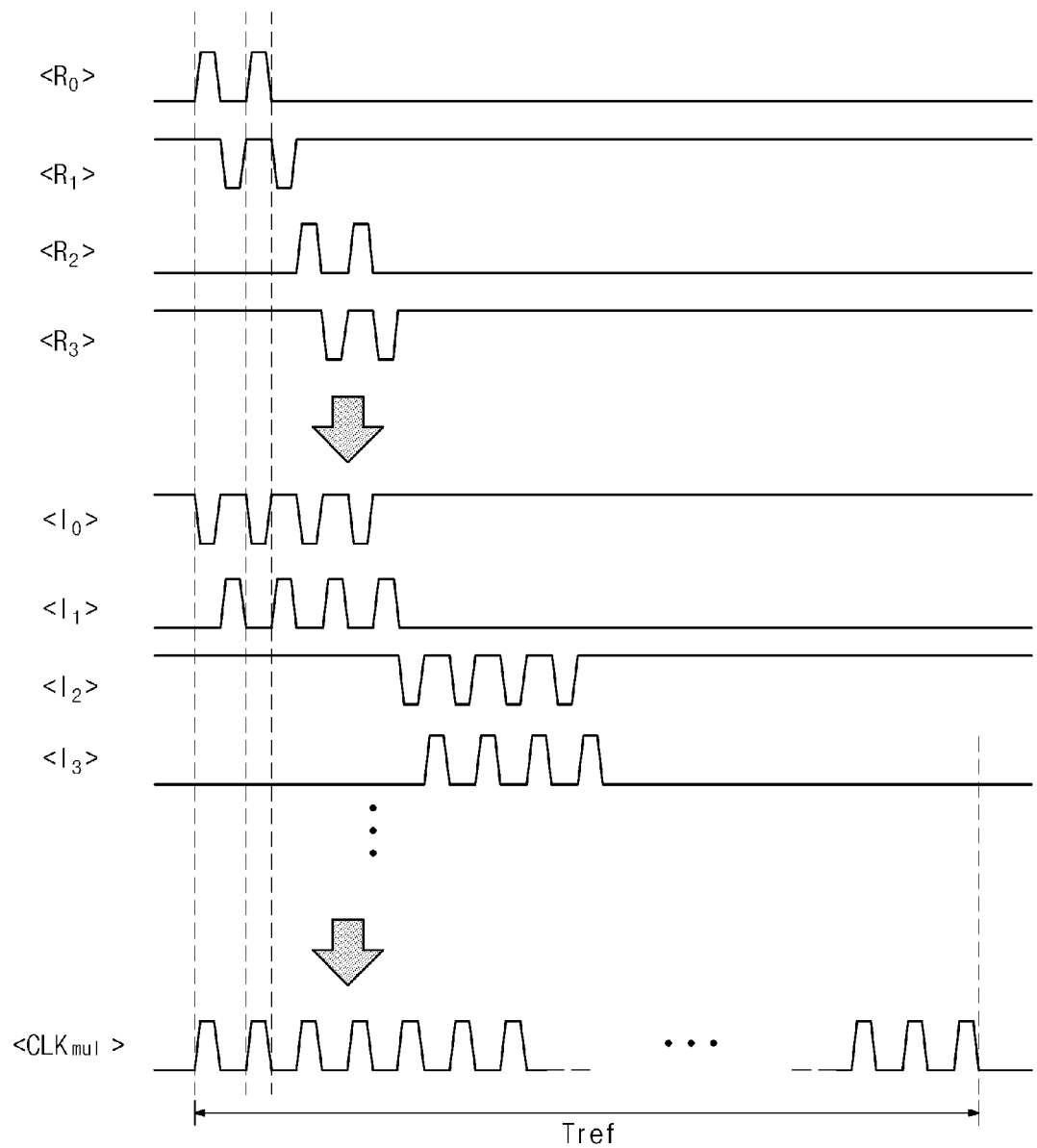
FIG. 5 is a timing diagram illustrating a signal process through a multiplication unit in accordance with some embodiments of the inventive concept.

FIG. 5 is a timing diagram illustrating a signal process through a multiplication unit in accordance with some embodiments of the inventive concept.

Referring to FIGS. 4 and 5, the NAND control logic gate 221a can receive the first correction pulse signals $P_0$, $P_2$, $P_4$, $P_6$ ..., $P_{28}$, $P_{30}$ respectively. The NAND control logic gate 221a can sequentially receive two first correction pulse signals. Thus, the number of NAND control logic gates 221a may be 8 as an illustration. The NAND control logic gates 221a performs a logic combination on the first correction pulse signals $P_0$ and $P_2$ to generate a first intermediate control signal $R_0$.

The NOR control logic gate 222a can receive the second correction pulse signals $P_1$, $P_3$, $P_5$, $P_7$ ..., $P_{29}$, $P_{31}$ respectively. The NOR control logic gate 222a can sequentially receive two second correction pulse signals. Thus, the number of NOR control logic gates 222a may be 8 as an illustration. The NOR control logic gates 222a performs a logic combination on the second correction pulse signals $P_1$ and $P_3$ to generate a second intermediate control signal $R_1$.

By repeating the process described above, the control NAND logic gates can generate first intermediate control signals $R_0$, $R_2$, ..., $R_{14}$ and the control NOR logic gates can generate second intermediate control signals $R_1$, $R_3$, ..., $R_{15}$.

The input NOR logic gates 221b can receive the first intermediate control signals $R_0$, $R_2$, ..., $R_4$ to generate first input control signals $I_0$, $I_2$, $I_4$ and $I_6$. The input NAND logic gates 222b can receive the second intermediate control signals $R_1$, $R_3$, ..., $R_{15}$ to generate second input control signals $I_1$, $I_3$, $I_5$ and $I_7$.

The generated first input control signals $I_0$, $I_2$, $I_4$ and $I_6$ can be input into gates of the PMOS transistors $Q_0$, $Q_2$, $Q_4$ and $Q_6$ respectively. The first input control signal $T_0$ may be input into a gate of the PMOS transistor $Q_0$. The generated second input control signals $I_1$, $I_3$, $I_5$ and $I_7$ can be input into gates of the NMOS transistors $Q_1$, $Q_3$, $Q_5$ and $Q_7$ respectively. The second input control signal $I_1$ may be input into a gate of the NMOS transistor $Q_1$.

An operation of the edge combiner 220 is as follows. As the first input control signal $I_0$ and the second input control signal $I_1$ are input to gates of the PMOS transistor $Q_0$ and the NMOS transistor $Q_1$ respectively, the PMOS transistor $Q_0$ and the NMOS transistor $Q_1$ may operate. As $I_0$ is input to a gate of the PMOS transistor $Q_0$, the PMOS transistor $Q_0$ operates to output a multiplication clock signal $CLK_{mul}$ of high level. As $I_1$ is input to a gate of the NMOS transistor $Q_1$, the NMOS transistor $Q_1$ operates to output a multiplication clock signal $CLK_{mul}$ of low level. As the first input control signal $I_0$ and the second input control signal $I_1$ are input, the multiplication clock signal of four pulses can be generated by repeating the operation described above four times.

Operations of the PMOS transistors $Q_2$, $Q_4$ and $Q_6$ may be the same with that of the PMOS transistor $Q_0$. Operations of the NMOS transistors $Q_3$, $Q_5$ and $Q_7$ may be the same with that of the NMOS transistor $Q_1$.

Thus, if the first input control signals $I_0$, $I_2$, $I_4$ and $I_6$ and the second input control signals $I_1$, $I_3$, $I_5$ and $I_7$ are input into gates of the PMOS transistors $Q_0$, $Q_2$, $Q_4$ and $Q_6$ and gates of the NMOS transistors $Q_1$, $Q_3$, $Q_5$ and $Q_7$ respectively, a multiplication clock signal $CLK_{mul}$ of 16 times can be generated.

The edge combiner 220 can generate a multiplication clock signal $CLK_{mul}$ of 16 times using four PMOS transistors and four NMOS transistors. Since an increase of junction capacitance of output terminal can be prevented, the maximum frequency can be increased. Power consumption can be reduced.

Figure 6:
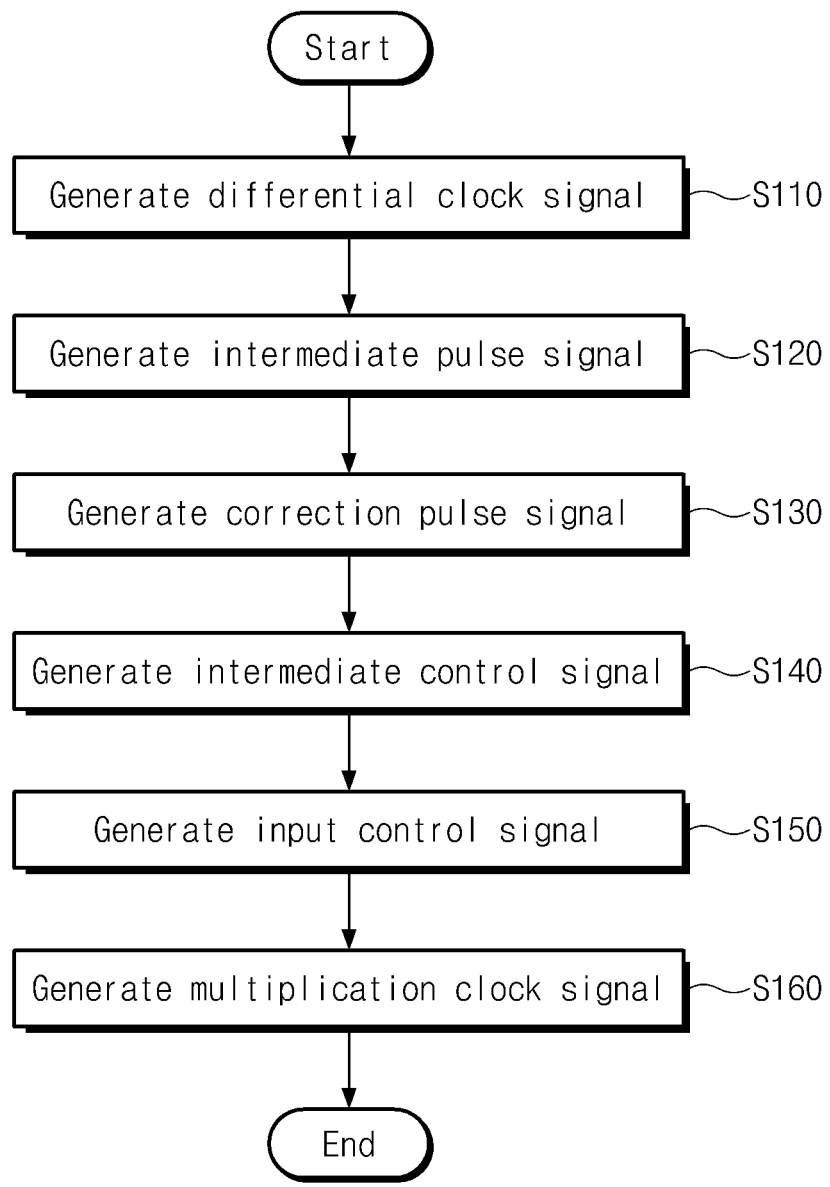
FIG. 6 is a flow chart illustrating a method of multiplying a frequency in accordance with some embodiments of the inventive concept.

FIG. 6 is a flow chart illustrating a method of multiplying a frequency in accordance with some embodiments of the inventive concept.

Referring to FIG. 6, a method of multiplying a frequency in accordance with some embodiments of the inventive concept may include a step S110 of generating a differential clock signal, a step S120 of generating an intermediate pulse signal, a step S130 of generating a correction pulse signal, a step S140 of generating an intermediate control signal, a step S150 of generating an input control signal and a step S160 of generating a multiplication clock signal.

The step S110 may mean a process of generating a clock signal by sequentially delaying the reference signal $CLK_{ref}$ and the inverted reference signal $CLK_{refb}$ through a plurality of delay cells of the delay locked loop.

The step S120 may mean a process of generating a first intermediate pulse signal and a second intermediate pulse signal by performing a logic combination on the differential clock signal through a NOR logic gate and an intermediate NAND logic gate.

The step S130 may mean a process of generating a first correction pulse signal by performing a logic combination on the first and second intermediate pulse signals through a correction NAND logic gate and generating a second correction pulse signal by performing a logic combination on the first and second intermediate pulse signals through a correction NOR logic gate.

The step S140 may mean a process of generating a first intermediate control signal by performing a logic combination on a first correction pulse signal through a control NAND logic gate and generating a second intermediate control signal by performing a logic combination on a second correction pulse signal through a control NOR logic gate.

The step S150 may mean a process of generating a first input control signal by performing a logic combination on the first intermediate control signal through an input NOR logic gate and generating a second input control signal by performing a logic combination on the second intermediate control signal through an input NAND logic gate.

The step S160 may mean a process of generating an output signal by inputting the first and second input control signals into gates of the PMOS and NMOS transistors respectively.

Figure 7:
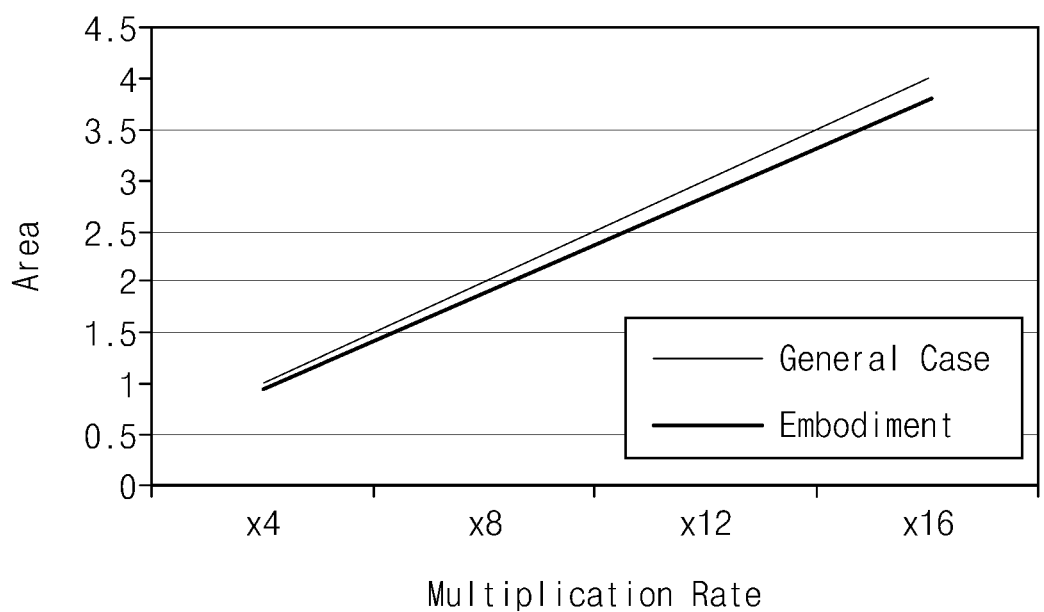
FIG. 7 is a graph illustrating an area relative to a multiplication rate of frequency multiplier in accordance with some embodiments of the inventive concept.

FIG. 7 is a graph illustrating an area relative to a multiplication rate of frequency multiplier in accordance with some embodiments of the inventive concept.

Referring to FIG. 7, as a multiplication rate increases, an area of frequency multiplier in accordance with some embodiments of the inventive concept becomes small as compared with a general frequency multiplier. When a multiplication rate is 16 times, an area reduction of frequency multiplier in accordance with some embodiments of the inventive concept becomes apparent as compared with a general frequency multiplier. The general frequency multiplier means a case of embodying a pulse generator using a flip-flop circuit and embodying an edge combiner using only a PMOS transistor and an NMOS transistor. Since a multiplication clock signal of high magnification is required in many of electronic devices, the frequency multiplier in accordance with some embodiments of the inventive concept may be mainly used in an electronic device requiring a multiplication rate of 16 times or more.

Figure 8:
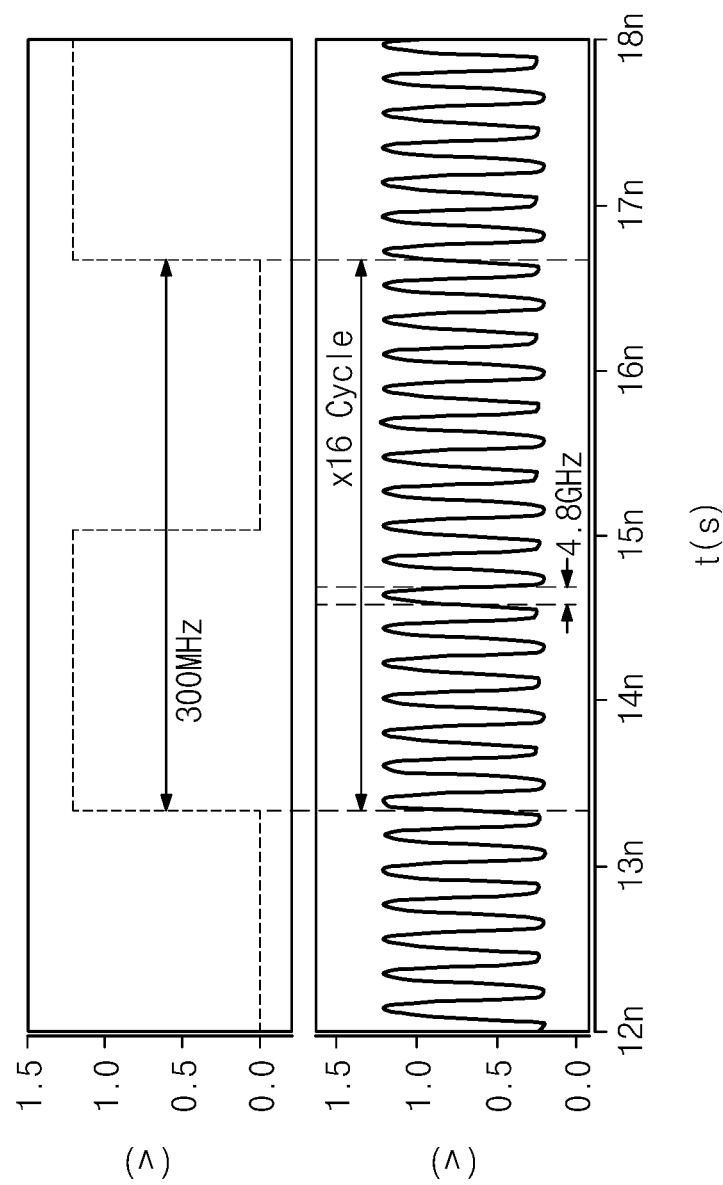
FIG. 8 is a drawing illustrating a multiplication clock signal of frequency multiplier in accordance with some embodiments of the inventive concept.

FIG. 8 is a drawing illustrating a multiplication clock signal of frequency multiplier in accordance with some embodiments of the inventive concept. In FIG. 8, a multiplication clock signal of frequency multiplier having a multiplication rate of 16 times is illustrated. As an illustration, a reference clock signal having 300 MHz has multiplied to a signal having a frequency of 4.8 GHz.

Figure 9:
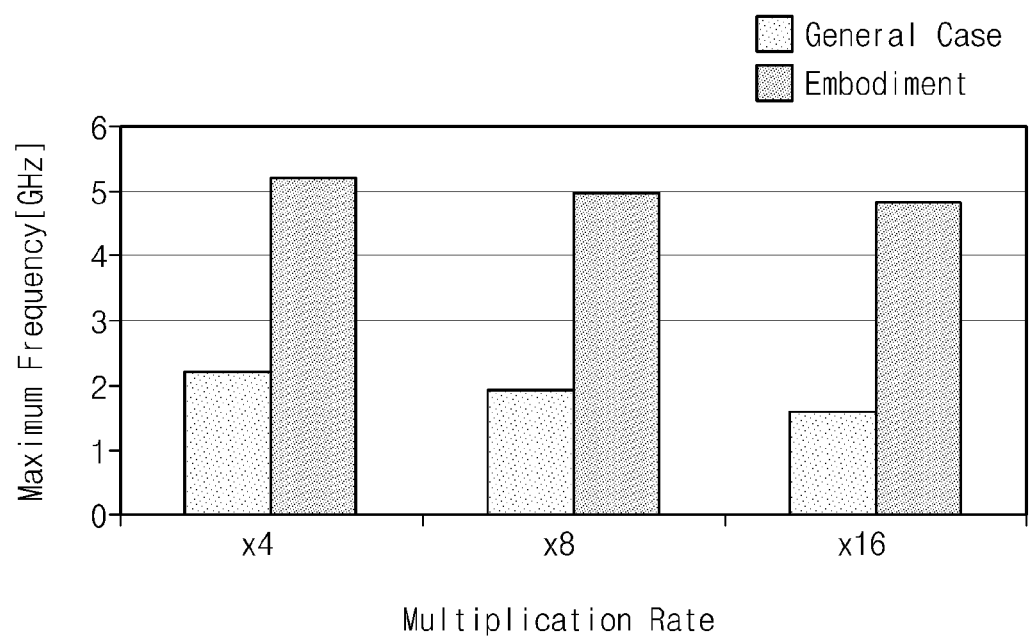
FIG. 9 is a graph illustrating the maximum frequency relative to a multiplication rate of frequency multiplier in accordance with some embodiments of the inventive concept.

FIG. 9 is a graph illustrating the maximum frequency relative to a multiplication rate of frequency multiplier in accordance with some embodiments of the inventive concept.

Referring to FIG. 9, in a frequency multiplier in accordance with some embodiments of the inventive concept, as a multiplication rate increases, the degree of reduction of the maximum frequency is less than that of general frequency multiplier. The general frequency multiplier embodies a pulse generator using a flip-flop circuit and embodies an edge combiner only by a PMOS transistor and an NMOS transistor. In case of the general frequency multiplier, an overlap between pulses generated from a pulse generator occurs and thereby a PMOS transistor and an NMOS transistor are turned on at the same time.

A frequency multiplier in accordance with some embodiments of the inventive concept can correct an overlap between pulse signals generated from a pulse generator. A frequency multiplier in accordance with some embodiments of the inventive concept can reduce power consumption. A frequency multiplier in accordance with some embodiments of the inventive concept can increase the maximum frequency without increasing junction capacitance of output terminal of edge combiner.

What is claimed is:

1. A frequency multiplier comprising:
a pulse generator receiving a differential clock signal from a delay locked loop having a plurality of delay cells to generate a pulse signal for generation of a multiplication clock signal, wherein the pulse generator comprises:
an intermediate pulse signal generation unit receiving the differential clock signal to generate intermediate pulse signals; and
an overlap correction unit correcting an overlap between the intermediate pulse signals by removing an overlap between the intermediate pulse signals to generate correction pulse signals for generation of the multiplication clock signal.

2. A frequency multiplier comprising:
a pulse generator receiving a differential clock signal from a delay locked loop having a plurality of delay cells to generate a pulse signal for generation of a multiplication clock signal, wherein the pulse generator comprises:
an intermediate pulse signal generation unit receiving the differential clock signal to generate intermediate pulse signals; and
an overlap correction unit correcting an overlap between the intermediate pulse signals to generate correction pulse signals; and
an edge combiner receiving the correction pulse signal to generate the multiplication clock signal.

3. The frequency multiplier of claim 2, wherein the edge combiner comprises:
a control NAND logic gate receiving the correction pulse signal to generate a first intermediate control signal;
an input NOR logic gate receiving the first intermediate control signal to generate a first input control signal;
a control NOR logic gate receiving the correction pulse signal to generate a second intermediate control signal; and
an input NAND logic gate receiving the second intermediate control signal to generate a second input control signal.

4. The frequency multiplier of claim 3, wherein the edge combiner further comprises:
a PMOS transistor receiving the first input control signal; and
an NMOS transistor receiving the second input control signal.

5. The frequency multiplier of claim 2, wherein the intermediate pulse signal generation unit comprises an intermediate NAND logic gate and an intermediate NOR logic gate which receive the differential clock signal to generate intermediate pulse signals.

6. The frequency multiplier of claim 5, wherein the overlap correction unit comprises a correction NAND logic gate and a correction NOR logic gate which receive output signals of the intermediate NAND logic gate and the intermediate NOR logic gate to generate a correction pulse signal.

7. A frequency multiplier comprising:
a delay locked loop comprising a first delay line connecting a plurality of delay cells sequentially delaying a reference signal and a second delay line connecting the plurality of delay cells;
an intermediate pulse signal generation unit connected to the first and second delay lines and generating intermediate pulse signals; and
an overlap correction unit connected to the intermediate pulse signal generation unit and correcting an overlap between the intermediate pulse signals by removing an overlap between the intermediate pulse signals to generate a correction pulse signal for generation of a multiplication clock signal.

8. A frequency multiplier comprising:
a delay locked loop comprising a first delay line connecting a plurality of delay cells sequentially delaying a reference signal and a second delay line connecting the plurality of delay cells;
an intermediate pulse signal generation unit connected to the first and second delay lines and generating intermediate pulse signals; and
an overlap correction unit connected to the intermediate pulse signal generation unit and correcting an overlap between the intermediate pulse signals to generate a correction pulse signal,
wherein the intermediate pulse signal generation unit comprises:
an intermediate NOR logic gate receiving an input signal of nth ($n \geq 1$, n is an odd number) delay cell of the second delay line and an input signal of n+1th ($n \geq 1$, n is an odd number) delay cell of the first delay line to generate a first intermediate pulse signal; and
an intermediate NAND logic gate receiving an input signal of n+1th ($n \geq 1$, n is an odd number) delay cell of the first delay line and an input signal of n+2th ($n \geq 1$, n is an odd number) delay cell of the second delay line to generate a second intermediate pulse signal.

9. The frequency multiplier of claim 8, wherein the overlap correction unit comprises:
a correction NAND logic gate receiving an output signal of nth ($n \geq 1$, n is an odd number) intermediate NOR logic gate among the intermediate NOR logic gates and an output signal of n+1th ($n \geq 1$, n is an odd number) NAND logic gate among the intermediate NAND logic gates to generate a first correction pulse signal; and a correction NOR logic gate receiving an output signal of n+2th (n≥1, n is an odd number) intermediate NOR logic gate among the intermediate NOR logic gates and an output signal of n+1th (n≥1, n is an odd number) NAND logic gate among the intermediate NAND logic gates to generate a second correction pulse signal.

10. A frequency multiplier comprising:
a delay locked loop comprising a first delay line connecting a plurality of delay cells sequentially delaying a reference signal and a second delay line connecting the plurality of delay cells;
an intermediate pulse signal generation unit connected to the first and second delay lines and generating intermediate pulse signals;
an overlap correction unit connected to the intermediate pulse signal generation unit and correcting an overlap between the intermediate pulse signals to generate a correction pulse signal; and
an edge combiner connected to the overlap correction unit and receiving the correction pulse signal to generate a multiplication clock signal.

11. The frequency multiplier of claim 10, wherein the edge combiner comprises:
a control NAND logic gate connected to the overlap correction unit;
an input NOR logic gate connected to the control NAND logic gate;
a control NOR logic gate connected to the overlap correction unit; and
an input NAND logic gate connected to the control NOR logic gate.

12. The frequency multiplier of claim 11, wherein the edge combiner further comprises:
a PMOS transistor connected to the input NOR logic gate; and
an NMOS transistor connected to the input NAND logic gate,
wherein the PMOS transistor and the NMOS transistor are connected to each other.

13. A frequency multiplier comprising:
a delay locked loop comprising a first delay line connecting a plurality of delay cells sequentially delaying a reference signal and a second delay line connecting the plurality of delay cells;
a plurality of NOR logic gates receiving an input signal of nth (n≥1, n is an odd number) delay cell of the second delay line and an input signal of n+1th (n≥1, n is an odd number) delay cell of the first delay line to generate a first pulse signal; and
a plurality of NAND logic gates receiving an input signal of n+1th (n≥1, n is an odd number) delay cell of the first delay line and an input signal of n+2th (n≥1, n is an odd number) delay cell of the second delay line to generate a second pulse signal.

14. A method of multiplying a frequency comprising:
receiving a differential clock signal from a delay locked loop having a plurality of delay cells to generate intermediate pulse signals for generation of multiplication clock signal;
performing a logic combination on the intermediate pulse signals to remove an overlap between the intermediate pulse signals to generate correction pulse signals for generation of the multiplication clock signal; and
generating the multiplication clock signal using the correction pulse signals.

15. A method of multiplying a frequency comprising:
receiving a differential clock signal from a delay locked loop having a plurality of delay cells to generate intermediate pulse signals for generation of multiplication clock signal;
performing a logic combination on the intermediate pulse signals to generate correction pulse signals; and
generating the multiplication clock signal using the correction pulse signals,
wherein generating the multiplication clock signal comprises:
performing a logic combination on the correction pulse signals to generate an intermediate control signal; and
performing a logic combination on the intermediate control signals to generate an input control signal.

* * * * *